(12) United States Patent
Kim et al.

(10) Patent No.: US 8,350,579 B2
(45) Date of Patent: Jan. 8, 2013

(54) METHOD AND APPARATUS FOR OPTIMIZING WHEATSTONE BRIDGE ROBUST IN CHANGE IN TEMPERATURE

(75) Inventors: Jong Pal Kim, Seoul (KR); Sang-kon Bae, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 489 days.

(21) Appl. No.: 12/565,310

(22) Filed: Sep. 23, 2009

(65) Prior Publication Data
US 2010/0123468 A1 May 20, 2010

(30) Foreign Application Priority Data
Nov. 20, 2008 (KR) .................... 10-2008-0115806

(51) Int. Cl.
*G01R 27/02* (2006.01)
*G01R 27/08* (2006.01)
*G01R 27/32* (2006.01)
*G01R 17/10* (2006.01)

(52) U.S. Cl. ......... 324/648; 324/610; 324/706; 324/725

(58) Field of Classification Search .................... 324/648
See application file for complete search history.

(56) References Cited

U.S. PATENT DOCUMENTS

| 4,023,094 A * | 5/1977 | Adams | 324/610 |
|---|---|---|---|
| 6,098,464 A | 8/2000 | Avisse et al. | |
| 6,474,172 B1 * | 11/2002 | Rolff et al. | 73/755 |
| 6,724,202 B2 * | 4/2004 | Tanizawa | 324/725 |
| 6,889,554 B2 * | 5/2005 | Hirota et al. | 73/719 |

FOREIGN PATENT DOCUMENTS

| JP | 05-113421 | 5/1993 |
|---|---|---|
| JP | 1993-113421 A | 5/1993 |
| JP | 2000-088891 | 3/2000 |
| JP | 2000-088891 A | 3/2000 |
| JP | 2000-249507 | 9/2000 |
| JP | 2001-272325 | 10/2001 |
| JP | 2001-272325 A | 10/2001 |
| JP | 2004-093321 | 3/2004 |
| JP | 2004-093321 A | 3/2004 |

* cited by examiner

*Primary Examiner* — Paresh Patel
*Assistant Examiner* — Kathryn Chang
(74) *Attorney, Agent, or Firm* — Cantor Colburn LLP

(57) ABSTRACT

An apparatus for optimizing a Wheatstone bridge robust in a temperature change, the apparatus including; a voltage difference measuring unit which measures a voltage difference between a current input end and a current output end of the Wheatstone bridge, wherein the Wheatstone bridge comprises a first resistor, a second resistor, a third resistor and a fourth resistor and a tuning resistor; and a resistance tuning controller which detects a resistance ratio of a first distribution resistance and a second distribution resistance of the tuning resistor so that the voltage difference measuring unit measures a maximum voltage difference, and controls tuning of the tuning resistor according to the detected resistance ratio.

11 Claims, 5 Drawing Sheets

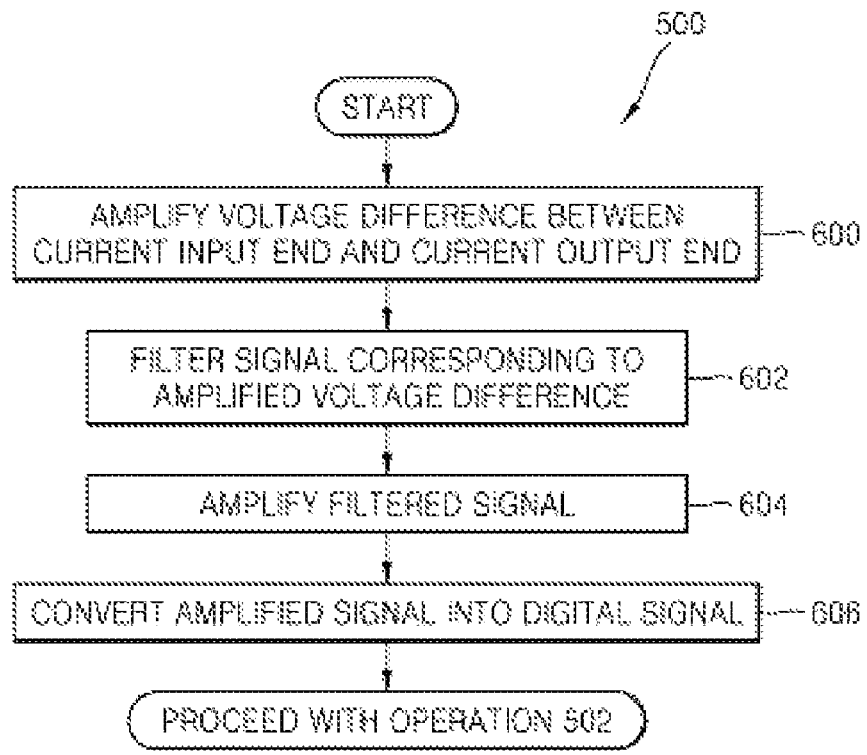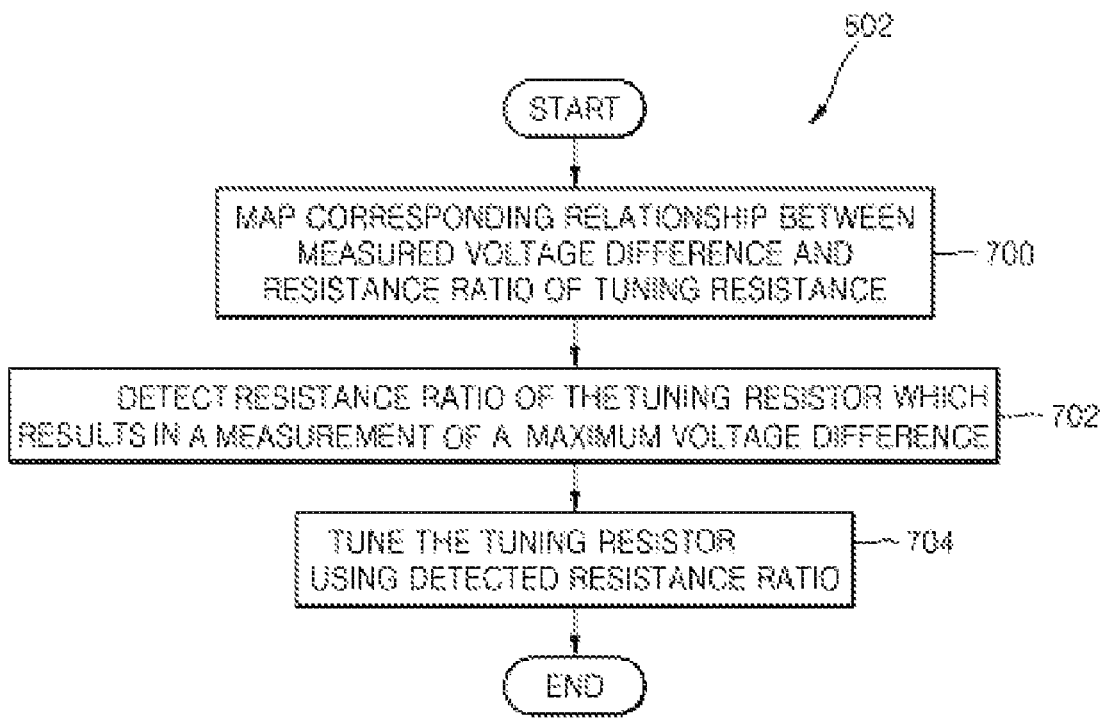

METHOD AND APPARATUS FOR OPTIMIZING WHEATSTONE BRIDGE ROBUST IN CHANGE IN TEMPERATURE

CROSS-REFERENCE TO RELATED APPLICATION

This application claims priority to Korean Patent Application No. 10-2008-0115806, filed on Nov. 20, 2008, and all the benefits accruing therefrom under 35 U.S.C. §119, the content of which in its entirety is herein incorporated by reference.

BACKGROUND

1. Field

One or more exemplary embodiments relate to a pressure sensor or a contact force sensor that uses a Wheatstone bridge, and more particularly, to a technology for increasing performance of a sensor including a Wheatstone bridge that is insensitive to a temperature change.

2. Description of the Related Art

Pressure sensors or contact force sensors generally include a Wheatstone bridge, which is a particular type of electrical circuit. FIG. 1 is an equivalent circuit diagram of a conventional Wheatstone bridge. The conventional Wheatstone bridge basically comprises four resistors R1 through R4. Although the four resistors R1 through R4 are generally designed to have the same value, in actuality they have different values due to inconsistencies occurring in the actual manufacturing processes thereof. Also, the values of the four resistors R1 through R4 vary according to a temperature change thereof, e.g., due to variations in the ambient temperature of the environment in which the conventional Wheatstone bridge is disposed. Therefore, when a pressure or load is not externally applied to a piston bridge during an initial stage, an offset occurs between Vop and Von. A sensor that uses the Wheatstone bridge differentially amplifies voltages of Vop and Von using a high amplification end in order to obtain good output sensitivity. Thus, an initial offset between Vop and Von is further amplified at a final output end due to a high amplification rate, which unwontedly reduces an output span of the sensor or undesirably causes saturation.

SUMMARY

One or more exemplary embodiments include an apparatus and method for optimizing a Wheatstone bridge robust in a temperature change in order to minimize a temperature sensitivity of the Wheatstone bridge so that a basic function of a sensor which uses the Wheatstone bridge is not deteriorated due to the temperature change.

Additional aspects will be set forth in part in the description which follows and, in part, will be apparent from the description, or may be learned by practice of the invention.

An apparatus for optimizing a Wheatstone bridge robust in a temperature change includes; a voltage difference measuring unit which measures a voltage difference between a current input end and a current output end of the Wheatstone bridge, wherein the Wheatstone bridge comprises a first resistor, a second resistor, a third resistor, a fourth resistor and a tuning resistor, and a resistance tuning controller which detects a resistance ratio of a first distribution resistance and a second distribution resistance of the tuning resistor so that the voltage difference measuring unit measures a maximum voltage difference, and which controls tuning of the tuning resistor according to the detected resistance ratio.

A method of optimizing a Wheatstone bridge robust in a temperature change includes; measuring a voltage difference between a current input end and a current output end of the Wheatstone bridge, wherein the Wheatstone bridge comprises a first resistor, a second resistor, a third resistor, a fourth resistor and a tuning resistor; and detecting a resistance ratio of a first distribution resistance and a second distribution resistance of the tuning resistor so that the measured voltage difference is a maximum voltage difference, and tuning the tuning resistor according to the detected resistance ratio.

BRIEF DESCRIPTION OF THE DRAWINGS

These and/or other aspects, advantages and features of this disclosure will become more apparent and more readily appreciated from the following description of the exemplary embodiments, taken in conjunction with the accompanying drawings of which:

FIG. 7 is a flowchart illustrating an exemplary embodiment of an operation of measuring a voltage difference between a current input end and a current output end of an exemplary embodiment of a Wheatstone bridge comprising first through fourth resistors and an exemplary embodiment of a tuning resistance according to the inventive concept; and FIG. 8 is a flowchart illustrating an exemplary embodiment of an operation of detecting a resistance ratio of first and second distribution resistances of the tuning resistor to obtain a maximum voltage difference, and tuning the tuning resistor according to a detected resistance ratio according to the inventive concept.

DETAILED DESCRIPTION

Figure 1:
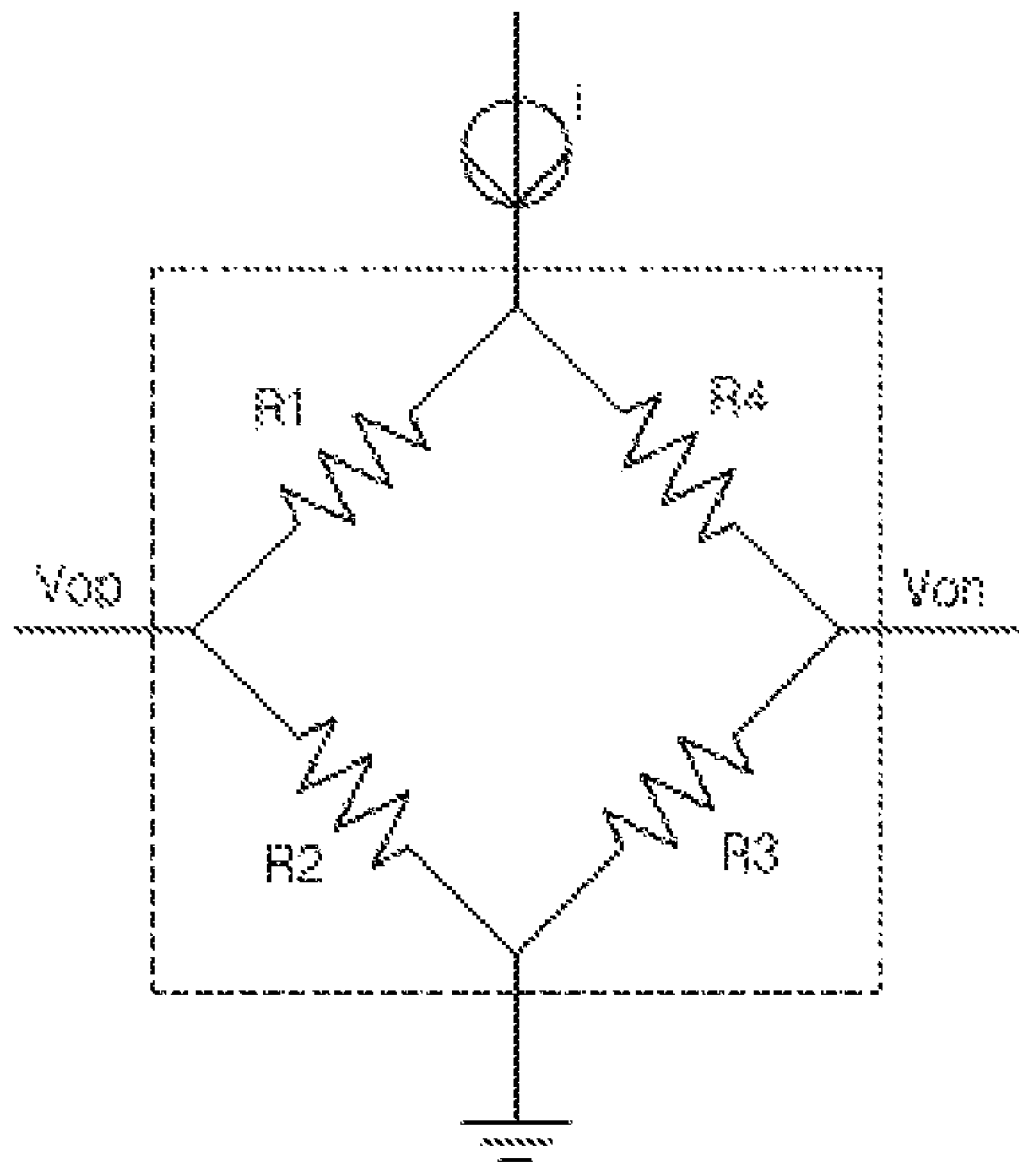
FIG. 1 is an equivalent circuit diagram of a conventional Wheatstone bridge.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2:
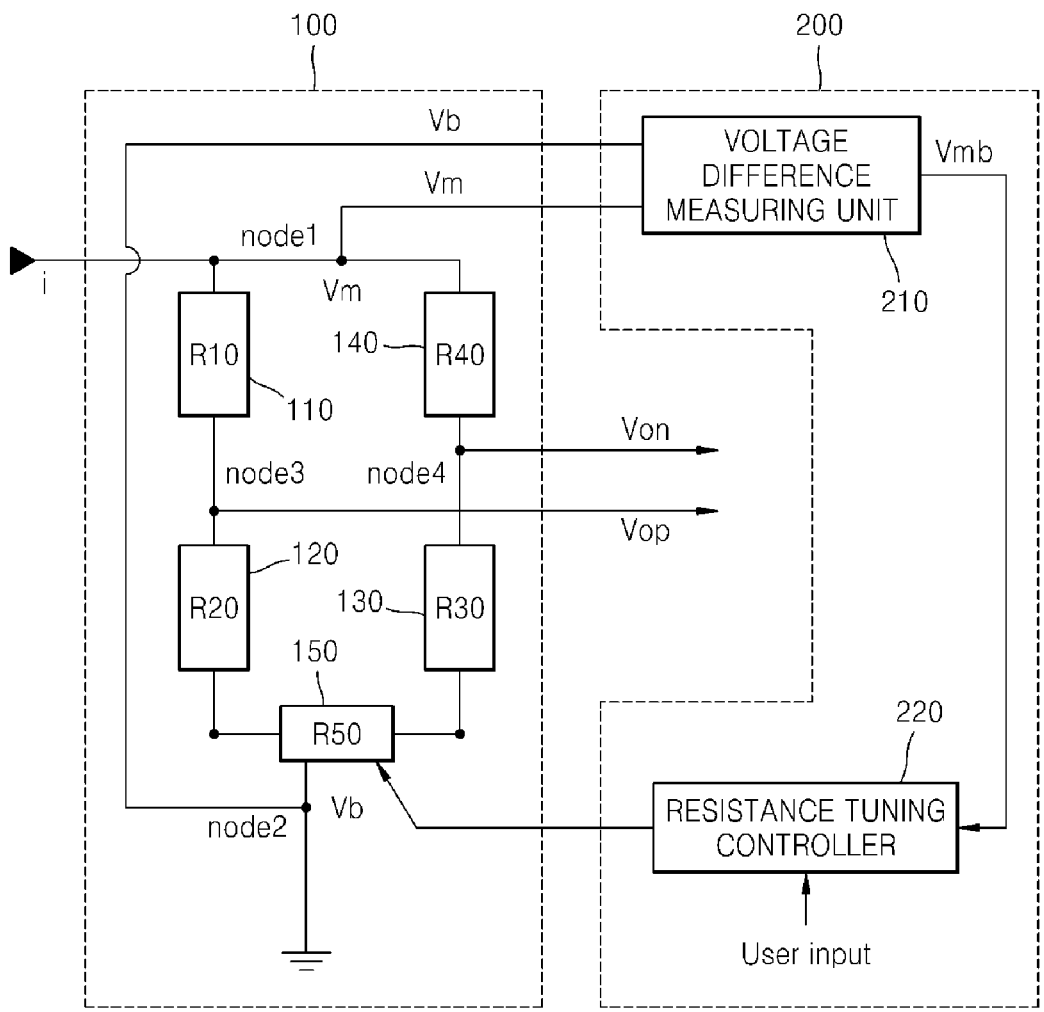
FIG. 2 is a block diagram of an exemplary embodiment of an apparatus for optimizing a Wheatstone bridge that is robust in a temperature change and the exemplary embodiment of a Wheatstone bridge connected to the apparatus according to the inventive concept.

FIG. 2 is an equivalent circuit diagram of an exemplary embodiment of an apparatus 200 for optimizing a Wheatstone bridge 100, wherein the apparatus exhibits robust characteristics during a change in temperature and an exemplary embodiment of the Wheatstone bridge connected to the apparatus 200 according to the inventive concept.

Referring to FIG. 2, the Wheatstone bridge 100 comprises first R10 through fourth R40 resistors 110 through 140 and a tuning resistor R50 150. The Wheatstone bridge 100 is a well-known technology and thus the detailed description thereof will not be repeated.

Meanwhile, the apparatus 200 for optimizing the Wheatstone bridge 100 which exhibits robust characteristics during the temperature change comprises a voltage difference measuring unit 210 and a resistance tuning controller 220.

The voltage difference measuring unit 210 measures a voltage difference Vm−Vb between a voltage Vm at a current input end nodel and a voltage Vb at a current output end node2 of the Wheatstone bridge 100, and sends the measurement result to the resistance tuning controller 220.

Figure 3:
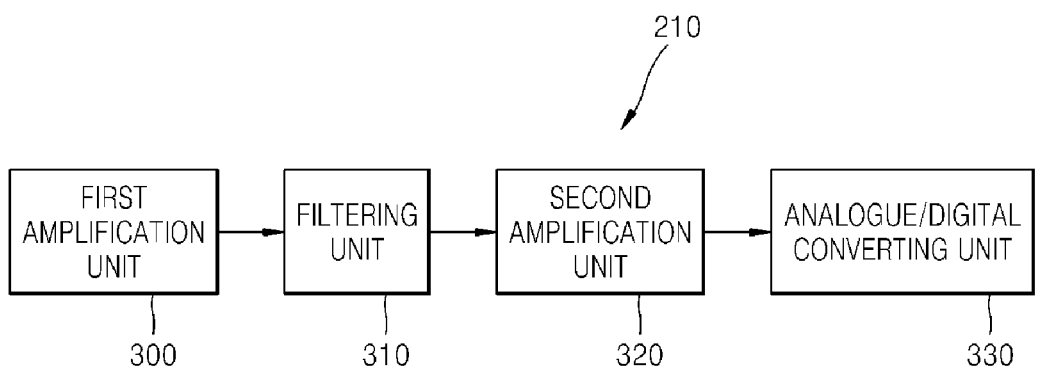
FIG. 3 is a block diagram illustrating an exemplary embodiment of a voltage difference measuring unit shown in FIG. 2 according to the inventive concept.

FIG. 3 is a block diagram illustrating an exemplary embodiment of the voltage difference measuring unit 210 shown in FIG. 2 according to the inventive concept. Referring to FIG. 3, the voltage difference measuring unit 210 comprises a first amplification unit 300, a filtering unit 310, a second amplification unit 320, and an analogue/digital converting unit 330.

The first amplification unit 300 amplifies the voltage difference Vm-Vb between the current input end nodel and the current output end node2, and sends an amplification signal to the filtering unit 310. Exemplary embodiments of the first amplification unit 300 may include a differential amplifier.

The filtering unit 310 filters a signal corresponding to the amplified voltage difference with respect to a desired bandwidth, and sends the filtered signal to the second amplification unit 320. Exemplary embodiments of the filtering unit 310 may include a low pass filter.

The second amplification unit 320 amplifies the signal filtered in the filtering unit 310 and sends the amplification signal to the analogue/digital converting unit 330.

The analogue/digital converting unit 330 converts an analogue signal amplified by the second amplification unit 320 into a digital signal, and sends the digital signal Vmb to the resistance tuning controller 220.

The resistance tuning controller 220 detects a resistance ratio of first and second distribution resistances of the turning resistor R50 150 in order to maximize the voltage difference Vm−Vb measured by the voltage difference measuring unit 210, and controls tuning of the tuning resistor R50 150 according to the detected resistance ratio. In one exemplary embodiment, the resistor R50 may be a variable resistor.

Such a detection of the resistance ratio of first and second distribution resistances of the turning resistor R50 150 is carried out in order to minimize the sensitivity of a sensor with respect to a temperature change. This will now be described with reference to FIGS. 4A and 4B.

Figure 4A:
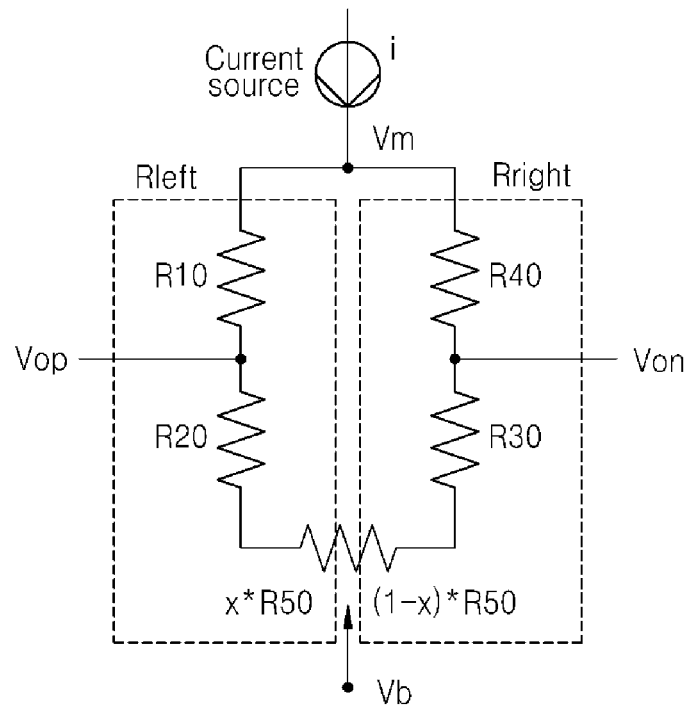
FIGS. 4A and 4B are equivalent circuit diagrams illustrating an exemplary embodiment of the condition for minimizing sensitivity to temperature of an exemplary embodiment of a Wheatstone bridge according to the inventive concept.
Figure 4B:
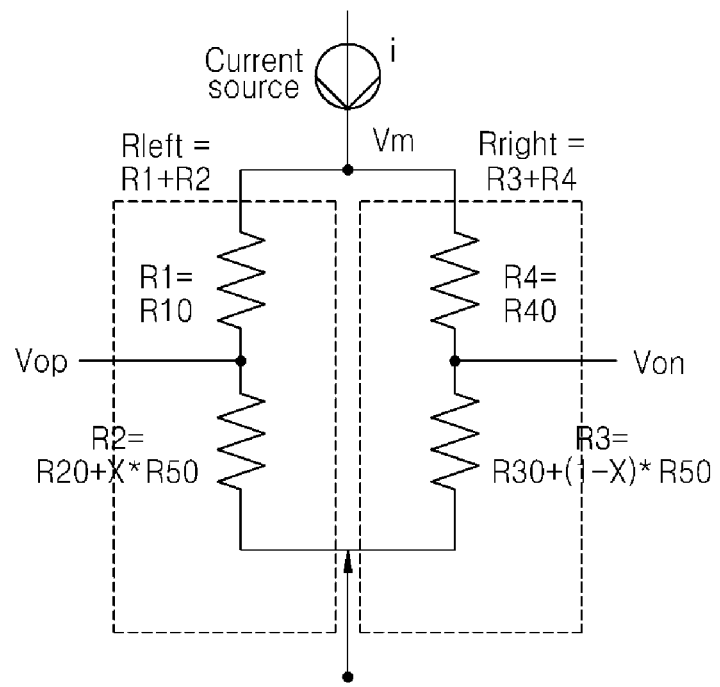

FIGS. 4A and 4B are equivalent circuit diagrams illustrating an exemplary embodiment of the condition for minimizing sensitivity to temperature of a Wheatstone bridge according to the inventive concept.

FIG. 4A shows the Wheatstone bridge including the tuning resistor R50. FIG. 4B shows the Wheatstone bridge including a plurality of resistors combined with the tuning resistor R50. In this regard, x and (1−x) are defined as a resistance ratio of the tuning resistor R50, and a resistance xR50 and (1−x)R50 obtained using the resistance ratio are defined as a first distribution resistance and a second distribution resistance, respectively.

Referring to FIG. 4B, R1 through R4 denote the first R10 through fourth R40 resistances and Vo denotes a measurement voltage Vop−Von, Vo is obtained by equation 1 below, $$Vo = i\frac{-R1[T,P]R3[T,P] + R2[T,P]R4[T,P]}{R1[T,P] + R2[T,P] + R3[T,P] + R4[T,P]} \quad \text{Equation 1)}$$

wherein, T and P denote factors in which a resistance R is a function of temperature and pressure. A temperature sensitivity of an output Vo=(Vop−Von) may be derived from equation 1 by equation 2 below, $$\partial_T V_0 = -i\frac{(R1[T,P] + R2[T,P] - R3[T,P] - R4[T,P])}{(R1[T,P] - R2[T,P] - R3[T,P] + R4[T,P])} \\ \frac{(R1[T,P] + R2[T,P] + R3[T,P] + R4[T,P])^2}{R1^{(1,0)}[T,P]} \quad \text{Equation 2)}$$

wherein, in $R1^{(1,0)}[T,P]$, a superscript 1 denotes a partial derivative with respect to a temperature T corresponding to a first factor. Likewise, a superscript 0 denotes an order of a partial derivative with respect to a pressure P corresponding to a second factor. Equation 2 is derived by equation 3 below.

$$R3^{(1,0)}[T,P] = R1^{(1,0)}[T,P]$$

$$R4^{(1,0)}[T,P] = R2^{(1,0)}[T,P]$$

$$R2^{(1,0)}[T,P] = R1^{(1,0)}[T,P] \quad \text{Equation 3)}$$

In equation 3, the temperature of each of the resistors R1 through R4 included in the Wheatstone bridge has a similar rate of change.

If a value obtained from equation 2 is 0, an output change according to the temperature of the sensor comprising the Wheatstone bridge is 0. The value obtained from equation 2 is 0 when a numerator is 0, which satisfies equations 4 and 5 below.

$$R1 + R2 = R3 + R4 \quad \text{Equation 4)}$$

Equation 4 is satisfied when Rleft=R1+R2 and Rright=R3+R4 as shown in FIG. 4B have the same value. Rleft and Rright may be expressed by equations 5 and 6, respectively, below.

$$R\text{left} = R10 + R20 + xR50 \quad \text{Equation 5)}$$

$$R\text{right} = R30 + R40 + (1-x)R50 \quad \text{Equation 6)}$$

An x value of the tuning resistor R50 satisfying equations 5 and 6 is obtained by equation 7 below.

$$x = \frac{1}{2} + \frac{-R10 - R20 + R30 + R40}{2R50} \quad \text{Equation 7)}$$

A maximum difference between a voltage Vm and a voltage Vb is obtained using the x value of the tuning resistance R50 satisfying equation 4 as expressed in equations 8 through 10 below.

$$Vmb = Vm - Vb \quad \text{Equation 8)}$$

$$= i\frac{1}{\frac{1}{R10 + R20 + xR50} + \frac{1}{R30 + R40 + (1-x)R50}}$$

$$\partial_x Vmb = \frac{iR50(-R10 - R20 + R30 + R40 + R50 - 2R50x)}{R10 + R20 + R30 + R40 + R50} \quad \text{Equation 9)}$$

$$\partial_x Vmb = 0 \quad \text{Equation 10)}$$

That is, a value satisfying equation 4 is obtained by adjusting a resistance ratio of the x value and (1−x) of the tuning resistor R50 and obtaining an x value where Vmb=(Vm−Vb) is at the maximum value.

Figure 5:
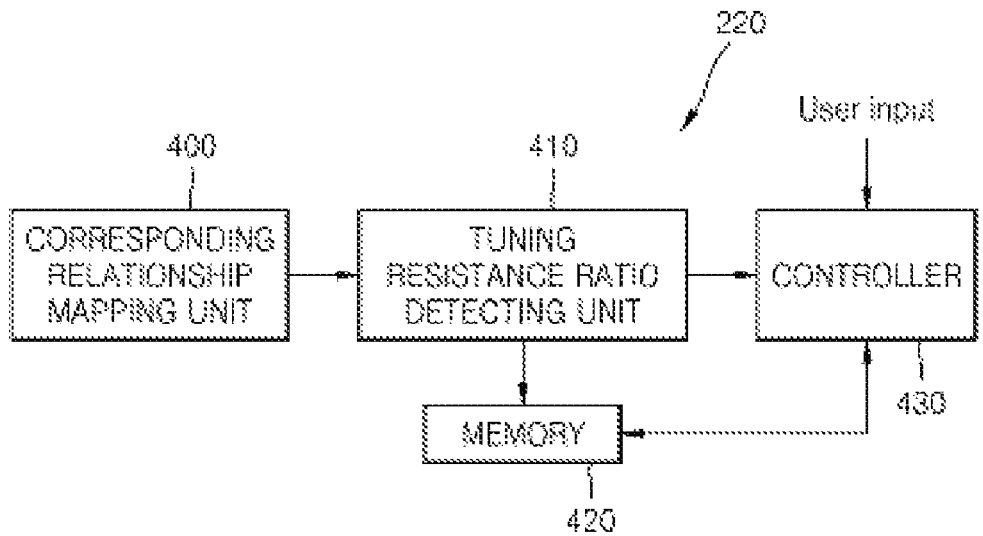
FIG. 5 is a block diagram of an exemplary embodiment of a resistance tuning controller shown in FIG. 2 according to the inventive concept.

FIG. 5 is a block diagram of an exemplary embodiment of the resistance tuning controller 220 shown in FIG. 2 according to the inventive concept. Referring to FIG. 5, the resistance tuning controller 220 comprises a corresponding relationship mapping unit 400, a tuning resistance ratio detecting unit 410, a memory 420, and a controller 430.

The corresponding relationship mapping unit 400 maps a corresponding relationship between a voltage difference received from the voltage difference measuring unit 210 and a resistance ratio of the tuning resistor R50, and sends a mapping result to the tuning resistance detecting unit 410. If the controller 430 determines the resistance ratio of the tuning resistor R50 and controls tuning of the tuning resistor R50, the voltage difference measuring unit 210 measures a corresponding voltage difference Vm−Vb. The corresponding relationship mapping unit 400 maps the corresponding relationship between the voltage difference Vm−Vb received from the voltage difference measuring unit 210 and the resistance ratio of the tuning resistance R50 determined by the controller 430. The tuning resistance ratio detecting unit 410 outputs information obtained by mapping the voltage difference Vm−Vb and the resistance ratio of the tuning resistor R50.

The tuning resistance ratio detecting unit 410 detects the resistance ratio of the tuning resistor R50 by which a maximum voltage difference Vm−Vb is obtained according to the corresponding relationship between the voltage difference Vm−Vb and the resistance ratio of the tuning resistor R50 that are mapped by the corresponding relationship mapping unit 400, and sends the detected resistance ratio to the memory 420 and the controller 430. The voltage difference Vm−Vb varies according to the resistance ratio of the tuning resistor R50. The tuning resistance ratio detecting unit 410 detects the resistance ratio by which the maximum voltage difference Vm−Vb is obtained by changing the resistance ratio and measuring the voltage difference Vm−Vb. In particular, referring to FIG. 4A, the maximum voltage difference Vm−Vb may be obtained when a sum of the first resistor R10, the second resistor R20, and the first distribution resistance xR50 that are connected in serial to each other is the same as a sum of the third resistor R30, the fourth resistor R40, and the second distribution resistance (1−x)R50 that are connected in serial to each other. Meanwhile, the maximum voltage difference Vm−Vb may be obtained as expressed in equation 2 when a sum of the first resistor R10 and the fourth resistor R40 that are connected in parallel to each other is the same as a sum of the tuning resistor R50 and the second resistor R20 and the third resistor R30 that are connected in parallel to each other.

The memory 420 stores the resistance ratio of the tuning resistor R50 by which the maximum voltage difference Vm−Vb is obtained. The memory 420 sends information about the stored resistance ratio of the tuning resistor R50 to the controller 430 according to an access request of the controller 430.

The controller 430 controls the tuning of the tuning resistor R50 by using the detected resistance ratio. The controller 430 determines the resistance ratio of the tuning resistor R50 according to a tuning input signal input by a user and controls the tuning resistor R50. According to a control command of the controller 430, the first and second distribution resistances of the tuning resistor R50 are determined and the voltage difference Vm−Vb is measured according to the determined and second distribution resistances. Meanwhile, if the controller 430 receives a signal indicating that a resistance ratio of the tuning resistor R50 is detected by which the maximum voltage difference Vm−Vb is obtained from the tuning resistance ratio detecting unit 410, the controller 430 accesses the resistance ratio of the tuning resistor R50 stored in the memory 420 by which the maximum voltage difference Vm−Vb is obtained, and controls the first and second distribution resistances of the tuning resistor R50 using information about the resistance ratio of the tuning resistor R50. The controller 430 controls the first and second distribution resistances of the tuning resistor R50 so that the Wheatstone bridge can be robust in a temperature change. Therefore, a temperature sensitivity of a voltage difference Vo=Vop−Von between a third node 3 and a fourth node 4 shown in FIG. 2 may be minimized.

Hereinafter, an exemplary embodiment of a method of optimizing the Wheatstone bridge robust in the temperature change according to the inventive concept will now be described with reference to FIGS. 6 through 8.

Figure 6:
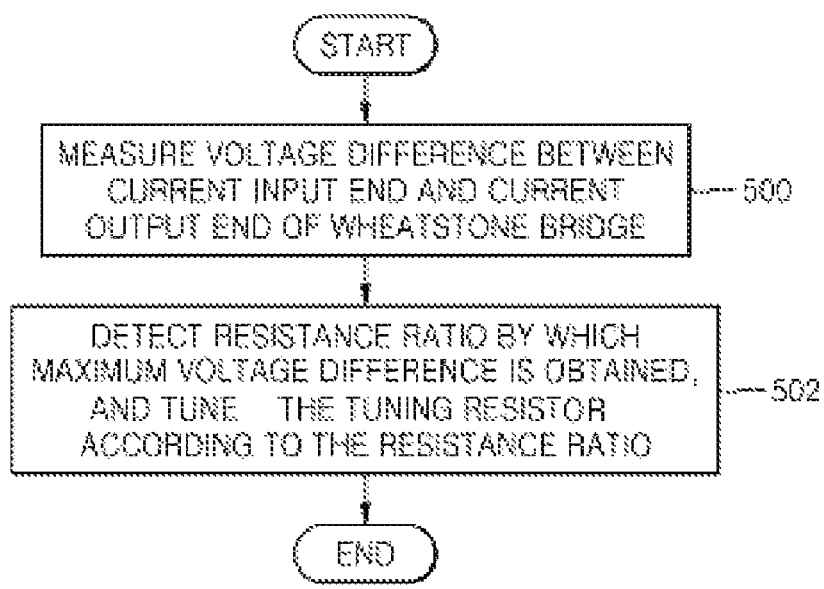
FIG. 6 is a flowchart illustrating an exemplary embodiment of a method of optimizing the exemplary embodiment of a Wheatstone bridge robust in the temperature change according to the inventive concept.

FIG. 6 is a flowchart illustrating an exemplary embodiment of a method of optimizing the Wheatstone bridge robust in the temperature change according to the inventive concept.

Referring to FIG. 6, in operation 500, a voltage difference between a current input end and a current output end of the Wheatstone bridge comprising first through fourth resistors and a tuning resistor is measured.

FIG. 7 is a flowchart illustrating operation 500 shown in FIG. 6 in more detail.

Referring to FIG. 7, in operation 600, the voltage difference between the current input end and the current output end is amplified.

In operation 602, a signal corresponding to the amplified voltage difference is filtered with respect to a desired bandwidth.

In operation 604, the filtered signal is amplified.

In operation 606, the amplified signal is converted into a digital signal.

Meanwhile, in operation 502, a resistance ratio of first and second distribution resistances of the tuning resistor is detected by which a maximum voltage difference is obtained, and the tuning resistance is tuned according to the detected resistance ratio.

FIG. 8 is a flowchart illustrating operation 502 shown in FIG. 6 in more detail.

Referring to FIG. 8, in operation 700, a corresponding relationship between the measured voltage difference and the resistance ratio of the tuning resistance is mapped. In more detail, a corresponding relationship between the voltage difference Vm−Vb received from the voltage difference measuring unit 210 and the resistance ratio of the tuning resistance determined by the controller 430 is mapped.

In operation 702, a resistance ratio of the tuning resistor by which the maximum resistance difference is obtained is detected according to the mapped corresponding relationship. The voltage difference Vm−Vb varies according to the resistance ratio of the tuning resistor. In particular, the maximum voltage difference Vm−Vb may be obtained when a sum of the first resistor R10, the second resistor R20, and the first distribution resistance xR50 that are connected in serial to each other is the same as a sum of the third resistor R30, the fourth resistor R40, and the second distribution resistance (1−x)R50 that are connected in serial to each other. Meanwhile, the maximum voltage difference Vm−Vb may be obtained when a sum of the first resistor R10 and the fourth resistor R40 that are connected in parallel to each other is the same as a sum of the tuning resistor R50 and the second resistance R20 and the third resistance R30 that are connected in parallel to each other.

Therefore, a resistance ratio of the tuning resistor is detected so that the sum of the first resistor R10, the second resistor R20, and the first distribution resistance xR50 that are connected in serial to each other is the same as a sum of the third resistor R30, the fourth resistor R40, and the second distribution resistance (1−x)R50 that are connected in serial to each other, or the sum of the first resistor R10 and the fourth resistor R40 that are connected in parallel to each other is the same as a sum of the tuning resistor R50 and the second resistor R20 and the third resistor R30 that are connected in parallel to each other.

In operation 704, the tuning resistor is tuned using the detected resistance ratio. The first and second distribution resistances of the tuning resistor are adjusted using the detected resistance ratio, thereby realizing the Wheatstone bridge which exhibits uniform characteristics despite a change in temperature.

In addition, the method of optimizing the exemplary embodiment of a Wheatstone bridge robust in the temperature change according to the inventive concept can also be implemented through computer readable code/instructions in/on a medium, e.g., a computer readable medium, to control at least one processing element to implement any above described exemplary embodiments. That is, a computer readable recording medium having a computer program recorded thereon for executing an operation of measuring a voltage difference between a current input end and a current output end of a Wheatstone bridge comprising first through fourth resistors and a tuning resistor, and an operation of detecting a resistance ratio of first and second distribution resistances of the tuning resistance which results in a measurement of a maximum voltage difference, and tuning the tuning resistor according to the detected resistance ratio can be implemented.

The computer readable code can be recorded/transferred on a medium in a variety of ways, with examples of the medium non-exclusively including recording media, such as magnetic storage media, exemplary embodiments of which include random access memory ("ROM"), floppy disks, hard disks, and various other similar devices, and optical recording media, exemplary embodiments of which include compact disc ROMs ("CD-ROMs"), or digital video discs ("DVDs"), and transmission media such as media carrying or including carrier waves, as well as elements of the Internet. Thus, the medium may be a defined and measurable structure including or carrying a signal or information, such as a device carrying a bitstream according to one or more exemplary embodiments. The media may also be a distributed network, so that the computer readable code is stored/transferred and executed in a distributed fashion. Furthermore, the processing element could include a processor or a computer processor, and processing elements may be distributed and/or included in a single device.

As described above, according to the one or more of the above embodiments, a sensor that uses a Wheatstone bridge minimizes a temperature sensitivity in order to prevent a basic function of the sensor from being deteriorated due to a temperature change, thereby obtaining reliability of a value detected by the sensor in spite of the temperature change, and not needing to compensate for the detected value.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An apparatus for optimizing a Wheatstone bridge robust in a temperature change, the apparatus comprising:
   a voltage difference measuring unit which measures a voltage difference between a current input end and a current output end of the Wheatstone bridge, wherein the Wheatstone bridge comprises a first resistor, a second resistor, a third resistor, a fourth resistor and a tuning resistor; and
   a resistance tuning controller which detects a resistance ratio of a first distribution resistance and a second distribution resistance of the tuning resistor so that the voltage difference measuring unit measures a maximum voltage difference, and which controls tuning of the tuning resistor according to the detected resistance ratio.

2. The apparatus of claim 1, wherein the voltage difference measuring unit comprises:
   a first amplification unit which amplifies the voltage difference between the current input end and the current output end;
   a filtering unit which filters a signal corresponding to the amplified voltage difference with respect to a desired bandwidth;
   a second amplification unit which amplifies the filtered signal; and
   an analogue to digital converting unit which converts the amplified signal into a digital signal.

3. The apparatus of claim 1, wherein the resistance tuning controller comprises:
   a corresponding relationship mapping unit which maps a corresponding relationship between the voltage difference received from the voltage difference measuring unit and the resistance ratio of the tuning resistor;
   a tuning resistance ratio detecting unit which detects a resistance ratio of the tuning resistor which results in a measurement of a maximum voltage difference, according to the corresponding relationship mapped by the corresponding relationship mapping unit;
   a memory which stores the detected resistance ratio; and
   a controller which controls the tuning of the tuning resistor using the detected resistance ratio.

4. The apparatus of claim 1, wherein the maximum voltage difference is measured when a sum of the resistances of the first resistor, the second resistor, and the first distribution resistance that are connected in serial to each other is substantially the same as a sum of the resistances of the third resistor, the fourth resistor, and the second distribution resistance that are connected in serial to each other.

5. The apparatus of claim 1, wherein the maximum voltage difference is measured when a sum of the resistances of the first resistor and the fourth resistor that are connected in parallel to each other is substantially the same as a sum of the resistance of the tuning resistor, the second resistor and the third resistor that are connected in parallel to each other.

6. A method of optimizing a Wheatstone bridge robust in a temperature change, the method comprising:
   measuring a voltage difference between a current input end and a current output end of the Wheatstone bridge, wherein the Wheatstone bridge comprises a first resistor, a second resistor, a third resistor, a fourth resistor and a tuning resistor; and
   detecting a resistance ratio of a first distribution resistance and a second distribution resistance of the tuning resistor so that the measured voltage difference is a maximum voltage difference, and tuning the tuning resistor according to the detected resistance ratio.

7. The method of claim 6, wherein the measuring of the voltage difference comprises:
   amplifying the voltage difference between the current input end and the current output end;
   filtering a signal corresponding to the amplified voltage difference with respect to a desired bandwidth;
   amplifying the filtered signal; and
   converting the amplified signal into a digital signal.

8. The method of claim 6, wherein tuning the tuning resistor comprises:
   mapping a corresponding relationship between the measured voltage difference and the resistance ratio of the tuning resistor;
   detecting a resistance ratio of the tuning resistor by which a maximum voltage difference is measured according to the mapped corresponding relationship; and
   tuning the tuning resistor using the detected resistance ratio.

9. The method of claim 6, wherein the maximum voltage difference is measured when a sum of the first resistor, the second resistor, and the first distribution resistor that are connected in serial to each other is the same as a sum of the third resistor, the fourth resistor, and the second distribution resistor that are connected in serial to each other.

10. The method of claim 6, wherein the maximum voltage difference is measured when a sum of the first resistor and the fourth resistor that are connected in parallel to each other is the same as a sum of the tuning resistor and the second resistor and the third resistor that are connected in parallel to each other.

11. A computer readable recording non-transitory medium storing a program for executing a method of optimizing a Wheatstone bridge robust in a temperature change, the method comprising:
   measuring a voltage difference between a current input end and a current output end of the Wheatstone bridge, the Wheatstone bridge comprising a first resistor, a second resistor, a third resistor and a fourth resistor and a tuning resistor;
   detecting a resistance ratio of a first distribution resistance and a second distribution resistance of the tuning resistor so that the measured voltage difference is a maximum voltage difference; and
   tuning the tuning resistor according to the detected resistance ratio.

* * * * *